(12) United States Patent
Lin

(10) Patent No.: US 6,548,226 B2
(45) Date of Patent: Apr. 15, 2003

(54) PHOTOLITHOGRAPHIC PROCESS

(75) Inventor: Chih-Yung Lin, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 114 days.

(21) Appl. No.: 09/780,551

(22) Filed: Feb. 9, 2001

(65) Prior Publication Data

US 2002/0110762 A1 Aug. 15, 2002

(51) Int. Cl.$^7$ .................................................. G03F 7/00
(52) U.S. Cl. ........................ 430/322; 430/326; 430/396
(58) Field of Search ............................... 430/322, 326, 430/396

(56) References Cited

U.S. PATENT DOCUMENTS

| | | | | |
|---|---|---|---|---|
| 5,206,117 A | * | 4/1993 | Labadie et al. | 430/325 |
| 5,650,261 A | * | 7/1997 | Winkle | 430/270.1 |
| 6,294,295 B1 | * | 9/2001 | Lin et al. | 430/5 |
| 6,338,934 B1 | * | 1/2002 | Chen et al. | 430/270.1 |
| 6,395,451 B1 | * | 5/2002 | Jung et al. | 430/270.1 |

* cited by examiner

Primary Examiner—Mark F. Huff
Assistant Examiner—Nicole Barreca

(57) ABSTRACT

A photolithographic process for patterning a photoresist layer over a substrate. A positive photoresist layer is formed over the substrate. The positive photoresist layer contains a photoacid generator and a photobase generator. The positive photoresist layer is exposed to light through a photomask so that the photoacid generator in the photoresist layer is changed into photoacid and the photobase generator is changed to photobase. The photomask has a first pattern region and a second pattern region that correspond with a first region and a second region of the photoresist layer. The first pattern region has a duty ratio greater than the second pattern region so that the first region is exposed to a higher light intensity than the second region. Finally, the positive photoresist layer is developed. The reaction threshold for turning the photobase generator into photobase is adjusted according to the exposure strength between the first region and the second region. Therefore, the quantity of photobase generated in the first region is much greater than in the second region. Ultimately, the diffusion of photoacid within the first region is blocked without affecting the development of the positive photoresist layer in the second region.

10 Claims, 2 Drawing Sheets

PHOTOLITHOGRAPHIC PROCESS

BACKGROUND OF THE INVENTION

1. Field of Invention

The present invention relates to a semiconductor process. More particularly, the present invention relates to a photolithographic process.

2. Description of Related Art

To improve the resolution and process window of photolithographic process, an ArF excimer laser light source and a corresponding ArF photoresist material are used. The ArF photoresist contains a photoacid generator that catalyzes the dissociation or association reaction of photoresist molecules so that a pattern is formed after development. However, the diffusion of photoacid in ArF positive photoresist after photo-exposure together with the need for producing lines with a narrow line width frequently aggravate the proximity effect. This often leads to considerably more reduction of line width for an isolated line pattern than for a densely packed line pattern. FIG. 1 is a schematic cross-sectional view showing the variation of line width between a conventional dense photoresist pattern and a conventional isolated photoresist pattern due to a variation of duty ratio. FIG. 1A is a schematic cross-sectional view of a photomask for producing the photoresist pattern shown in FIG. 1. The photomask 10 includes a dense pattern 12 and an isolated pattern 14. The dense pattern 12 and the isolated pattern 14 are used to produce a dense pattern 110a and an isolated pattern 110b on the substrate 100.

As shown in FIGS. 1 and 1A, the dense pattern 12 and the isolated pattern 14 on the photomask 10 both have a line width x. However, the dense pattern 12 has a duty ratio w:x of 1:1 while the isolated pattern 14 has a duty ratio y:x of 8:1. The dense photoresist pattern 110a on the substrate 100 has a line width of about 150 nm when the dense pattern 12 on the photomask is used. On the contrary, the isolated photoresist pattern 110b on the substrate 100 possibly has a line width of only about 60 nm when the isolated pattern 14 on the photomask is used. Because the difference in line width between the isolated photoresist pattern 110b and the dense photoresist pattern 110a is so big, simply employing an optical proximity correction (OPC) can hardly make any obvious improvement.

According to the results of an investigation, the large drop in line width in the isolated photoresist pattern relative to the dense photoresist pattern is due to the presence of a large background region surrounding the isolated photoresist pattern. FIG. 2 is a graph showing the variation of photoacid concentration in an ArF positive photoresist layer versus position, wherein a dense pattern is formed on the left, an isolated pattern is formed on the right and the direction of diffusion is indicated by arrows. According to the position versus photoacid concentration relationship in FIG. 2, the isolated pattern on the right is surrounded by a large quantity of photoacid. Ultimately, the diffusion of the photoacid leads to a great reduction of line width. Conversely, the dense pattern on the left is surrounded by only a small quantity of photoacid because the dense pattern already occupies a large portion of the region. Thus, line width is less affected by the diffusion of photoacid.

SUMMARY OF THE INVENTION

Accordingly, one object of the present invention is to provide a photolithographic process that utilizes the addition of photobase generator into a positive photoresist to counteract the photoacid generator in the photoresist, distributed according to the duty ratio of a pattern. The reaction threshold of the photobase generator to light is greater in a dense pattern region (having a smaller duty ratio) while the reaction threshold of the photobase generator to light is smaller in an isolated region (having a greater duty ratio). Hence, the amount of photobase generator produced in the isolated pattern region is much greater than that produced in the dense pattern region. The presence of photobase generator in the photoresist blocks some of the diffusion of photoacid generator and hence prevents severe reduction of line width in an isolated pattern region without affecting the development of positive photoresist in the dense pattern region.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
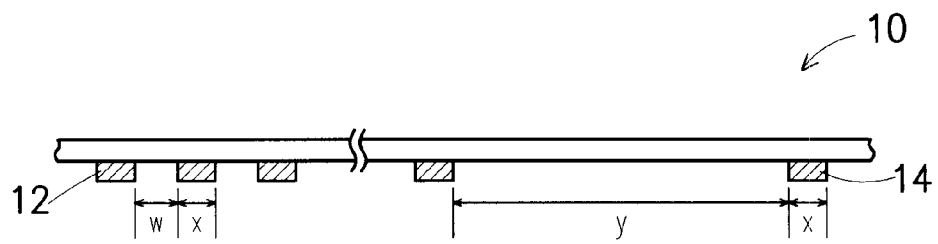
FIG. 1A is a schematic cross-sectional view of a photomask for producing the photoresist pattern shown in FIG. 1.
Figure 1:
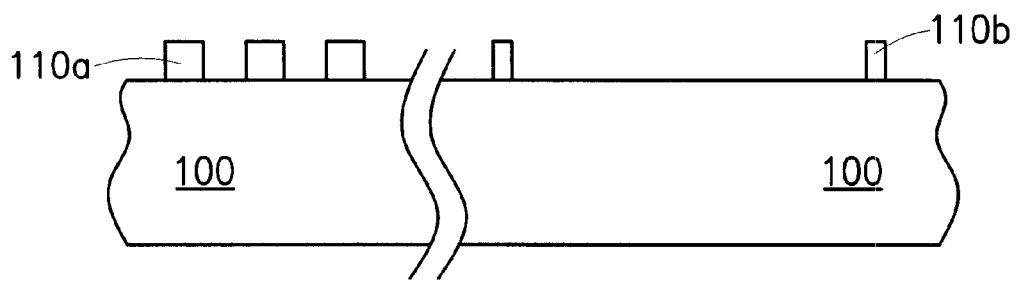
FIG. 1 is a schematic cross-sectional view showing the variation of line width between a conventional dense photoresist pattern and a conventional isolated photoresist pattern due to a variation of duty ratio.
Figure 2:
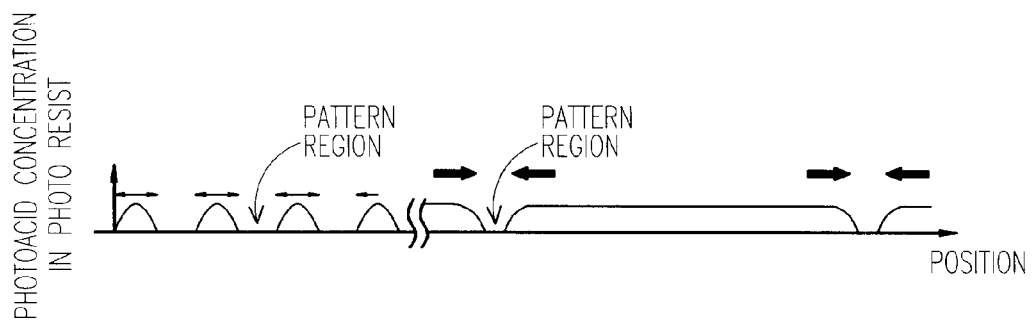
FIG. 2 is a graph showing the variation of photoacid concentration in an ArF positive photoresist layer versus position, wherein a dense pattern is formed on the left, an isolated pattern is formed on the right and the direction of diffusion is indicated by arrows.

Reference will now be made in detail to the present preferred embodiments of the invention, examples of which are illustrated in the accompanying drawings. Wherever possible, the same reference numbers are used in the drawings and the description to refer to the same or like parts.

In the following description of this invention, the production of a photoresist pattern having a line width of either 100 nm or 130 nm, using an ArF positive photoresist, is illustrated.

Figure 3:
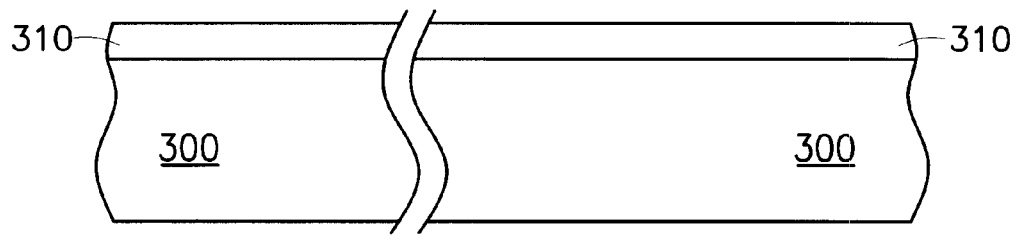
FIGS. 3 and 4 are schematic cross-sectional views showing the steps for producing a patterned photoresist layer over a substrate according to a photolithographic process of this invention.
Figure 4A:
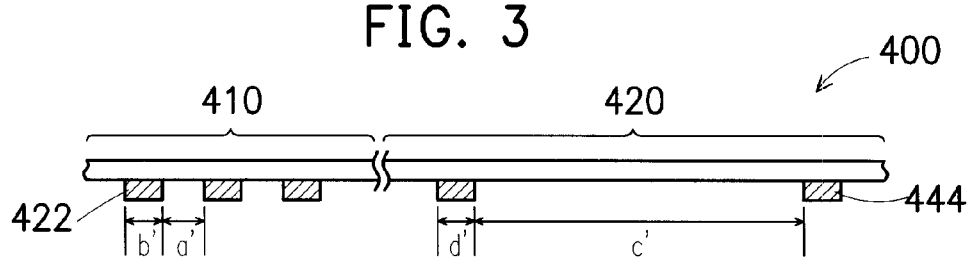
FIG. 4A is a schematic cross-sectional view of a photomask for producing the photoresist pattern shown in FIG. 4.
Figure 4B:
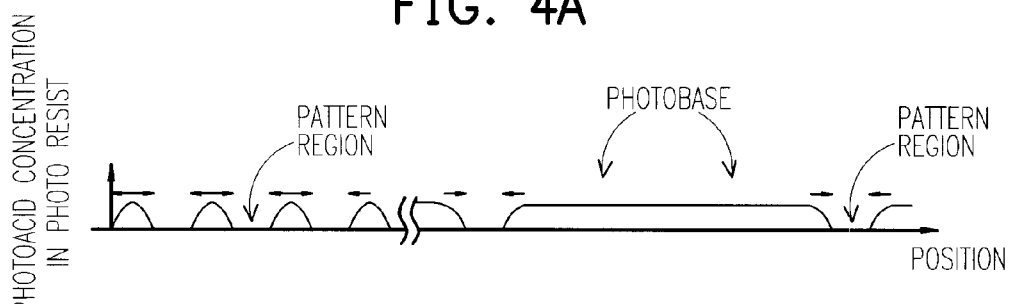
FIG. 4B is a graph showing the variation of photoacid concentration in an ArF positive photoresist layer versus position according to this invention, wherein a dense pattern is formed on the left, an isolated pattern is formed on the right and the direction of diffusion is indicated by arrows.
Figure 4:
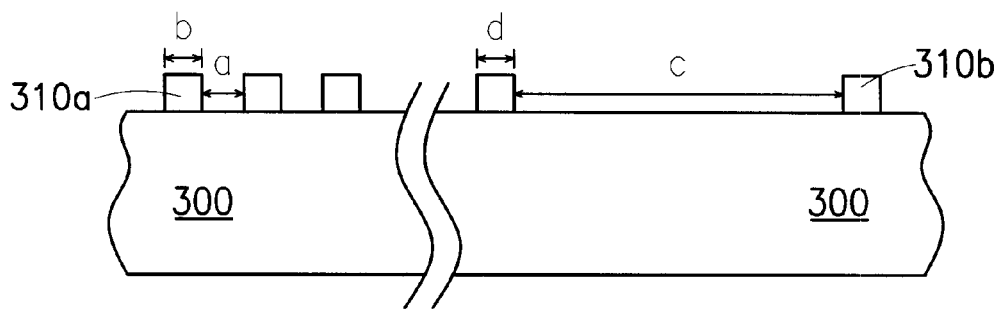

FIGS. 3 and 4 are schematic cross-sectional views showing the steps for producing a patterned photoresist layer over a substrate according to a photolithographic process of this invention. FIG. 4A is a schematic cross-sectional view of a photomask for producing the photoresist pattern shown in FIG. 4. FIG. 4B is a graph showing the variation of photoacid concentration in an ArF positive photoresist layer versus position according to this invention, wherein a dense pattern is formed on the left, an isolated pattern is formed on the right and the direction of diffusion is indicated by arrows.

As shown in FIG. 3, an ArF positive photoresist layer 310 is formed over a substrate 300. The ArF positive photoresist layer 310 contains photoacid generator and photobase generator. The photoresist layer 310 is formed, for example, by spin-coating. The photoacid generator and the photobase generator will react to produce photoacid and photobase when exposed to an ArF excimer laser source.

As shown in FIGS. 4A and 4, the ArF positive photoresist layer 310 is exposed to an ArF excimer laser source (not shown) through a photomask 400 (FIG. 4A). After excitation by the excimer laser, the photoacid generator in the exposed photoresist is converted into photoacid while the photobase generator in the exposed photoresist is converted into photobase. The photomask 400 has a dense pattern region 410 and an isolated pattern region 420. Furthermore, the dense pattern region 410 includes a dense pattern 422 of conductive lines, for example. The dense pattern 422 has a duty ratio a':b' of about 1:1. The isolated pattern region 420 includes an isolated pattern 444 of conductive lines, for example. The isolated pattern 444 has a duty ratio c':d' of about 8:1. Finally, the exposed photoresist layer 310 is developed in an alkaline developer so that a dense photoresist pattern 310a corresponding to the dense pattern 422 and an isolated photoresist pattern 310b corresponding to the isolated pattern 444 are simultaneously formed.

As shown in FIG. 4A, the dense pattern region 410 has a higher line density and hence less light is permitted to penetrate through the photomask 400. Conversely, the isolated pattern region 420 has a lower line density and hence more light is permitted to penetrate through the photomask 400. In other words, the intensity of light shining on the dense photoresist pattern 310a region is weaker while the intensity of light falling on the isolated photoresist pattern 310b region is stronger. In this invention, the reaction threshold of the photobase generator is adjusted to a level above the light exposure strength in the dense photoresist pattern 310a region but below the light exposure strength in the isolated photoresist pattern 310b region. Ultimately, a large quantity of photobase is produced in the isolated photoresist pattern 310b region so that the diffusion of photoacid is blocked without affecting the development of the dense photoresist pattern 310a region in the ArF positive photoresist layer 310. Nevertheless, the quantity of photobase generated within the isolated photoresist pattern 310b region must not be excessive because the development of the ArF positive photoresist layer 310 can be impeded. Consequently, the duty ratio a:b of the dense photoresist pattern 310a preferably conforms to the duty ratio a':b' of the dense pattern 422. Similarly, the duty ratio c:d of the isolated photoresist pattern 310b preferably conforms to the duty ratio c':d' of the isolated pattern 444. In general, light exposure strength in the dense photoresist pattern 310a region is smaller than half the light intensity at the source. On the other hand, light exposure strength in the isolated photoresist pattern 310b region is more than half the light intensity at the source. Therefore, the reaction threshold of the photobase generator is preferably set at about half the light intensity at the source so that a large quantity of photobase is produced in the isolated photoresist pattern 310b region while little photobase is produced in the dense photoresist pattern 310a region.

In addition, a duty ratio between 1:1 and 2:1 can be used beside a duty ratio of 1:1 for the dense pattern 422. Moreover, a duty ratio between 3:1 and 8:1 can be used beside a duty ratio of 8:1 for the isolated pattern 444.

In summary, photobase generator is added into the ArF positive photoresist in this invention. The reaction threshold of the photobase generator is adjusted so that a large quantity of photobase is produced only in the isolated pattern region of the ArF positive photoresist layer. Hence, the diffusion of photoacid in the isolated region is virtually blocked without affecting the development of the ArF positive photoresist layer in the dense pattern region. Ultimately, severe line width reduction in the isolated pattern region is prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A photolithographic process for patterning a photoresist layer over a substrate, comprising the steps of:

forming a positive photoresist layer over the substrate, wherein the positive photoresist layer contains a photoacid generator and a photobase generator;

changing the photoacid generator in the photoresist layer into photoacid and the photobase generator into photobase by shining a light source through a photomask, wherein the photomask has a first pattern region and a second pattern region that correspond with a first region and a second region of the photoresist layer, and the first pattern region has a duty ratio greater than the second pattern region so that the first region is exposed to a higher light intensity than the second region; and developing the positive photoresist layer;

wherein the reaction threshold for turning the photobase generator into photobase is adjusted according to the exposure strength between the first region and the second region so that the quantity of photobase generated in the first region is much greater than in the second region, and ultimately, the diffusion of photoacid within the first region is blocked without affecting the development of the positive photoresist layer in the second region.

2. The process of claim 1, wherein the positive photoresist layer includes an ArF positive photoresist layer.

3. The process of claim 1, wherein the reaction threshold for converting photobase generator into photobase is at a light intensity of about half of the source.

4. The process of claim 1, wherein the photolithographic process produces a line pattern having a line width of about 100 nm.

5. The process of claim 1, wherein the photolithographic process produces a line pattern having a line width of about 130 nm.

6. The process of claim 1, wherein the pattern in the first pattern region has a duty ratio between 3 and 8.

7. The process of claim 1, wherein the pattern in the first pattern region has a duty ratio greater than 8.

8. The process of claim 1, wherein the pattern in the second pattern region has a duty ratio between 1 and 2.

9. The process of claim 1, wherein the pattern in the first pattern region includes a conductive line pattern.

10. The process of claim 1, wherein the pattern in the second pattern region includes a conductive line pattern.

* * * * *